United States Patent
Alavoine

(10) Patent No.: US 9,703,493 B2
(45) Date of Patent: Jul. 11, 2017

(54) SINGLE-STAGE ARBITER/SCHEDULER FOR A MEMORY SYSTEM COMPRISING A VOLATILE MEMORY AND A SHARED CACHE

(71) Applicant: QUALCOMM INCORPORATED, San Diego, CA (US)

(72) Inventor: Olivier Alavoine, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/008,192

(22) Filed: Jan. 27, 2016

(65) Prior Publication Data

US 2017/0168727 A1    Jun. 15, 2017

Related U.S. Application Data

(60) Provisional application No. 62/267,182, filed on Dec. 14, 2015.

(51) Int. Cl.
| | |
|---|---|
| G06F 12/00 | (2006.01) |
| G06F 3/06 | (2006.01) |
| G06F 12/02 | (2006.01) |
| G06F 12/0868 | (2016.01) |
| G11C 7/10 | (2006.01) |

(52) U.S. Cl.
CPC .......... *G06F 3/0611* (2013.01); *G06F 3/0646* (2013.01); *G06F 3/0688* (2013.01); *G06F 12/0215* (2013.01); *G06F 12/0868* (2013.01); *G06F 2212/1024* (2013.01); *G06F 2212/281* (2013.01); *G06F 2212/305* (2013.01); *G06F 2212/3042* (2013.01); *G11C 7/1072* (2013.01)

(58) Field of Classification Search
None
See application file for complete search history.

(56) References Cited

U.S. PATENT DOCUMENTS

| | | | |
|---|---|---|---|
| 5,745,913 A | | 4/1998 | Pattin et al. |
| 5,813,038 A | * | 9/1998 | Thome ................ G06F 13/1631 |
| | | | 365/238.5 |
| 6,226,721 B1 | | 5/2001 | Strongin et al. |

(Continued)

OTHER PUBLICATIONS

Niladrish Chatterjee, "Designing efficient memory schedulers for future systems," The University of Utah, dissertation, 124 pages, Dec. 2013.

(Continued)

*Primary Examiner* — Brian Peugh
(74) *Attorney, Agent, or Firm* — Smith Tempel Blaha LLC

(57) ABSTRACT

Systems, methods, and computer programs are disclosed for scheduling memory transactions. An embodiment of a method comprises determining future memory state data of a dynamic random access memory (DRAM) for a predetermined number of future clock cycles. The DRAM is electrically coupled to a system on chip (SoC). Based on the future memory state data, one of a plurality of pending memory transactions is selected that speculatively optimizes DRAM efficiency. The selected memory transaction is sent to a shared cache controller. If the selected memory transaction results in a cache miss, the selected memory transaction is sent to a DRAM controller.

30 Claims, 6 Drawing Sheets

(56) References Cited

U.S. PATENT DOCUMENTS

| | | | |
|---|---|---|---|
| 6,381,672 B1* | 4/2002 | Strongin | G11C 7/1015 |
| | | | 365/238.5 |
| 7,761,656 B2 | 7/2010 | Madrid et al. | |
| 8,347,020 B2 | 1/2013 | Maddali et al. | |
| 8,560,796 B2 | 10/2013 | Xu et al. | |
| 8,615,638 B2 | 12/2013 | Shirlen et al. | |
| 2012/0059983 A1* | 3/2012 | Nellans | G06F 12/0215 |
| | | | 711/105 |
| 2014/0115273 A1 | 4/2014 | Chirca et al. | |

OTHER PUBLICATIONS

International Search Report and Written Opinion—PCT/US2016/062346—ISA/EPO—Feb. 20, 2017.

* cited by examiner

US 9,703,493 B2

SINGLE-STAGE ARBITER/SCHEDULER FOR A MEMORY SYSTEM COMPRISING A VOLATILE MEMORY AND A SHARED CACHE

PRIORITY CLAIM AND RELATED APPLICATION

This application claims priority under 35 U.S.C. §119(e) to U.S. Patent Application Ser. No. 62/267,182, filed Dec. 14, 2015, entitled, "SINGLE-STAGE ARBITER/SCHEDULER FOR A MEMORY SYSTEM COMPRISING A VOLATILE MEMORY AND A SHARED CACHE." The entire contents of which are hereby incorporated by reference.

DESCRIPTION OF THE RELATED ART

Portable computing devices (e.g., cellular telephones, smart phones, tablet computers, portable digital assistants (PDAs), portable game consoles, wearable devices, and other battery-powered devices) and other computing devices continue to offer an ever-expanding array of features and services, and provide users with unprecedented levels of access to information, resources, and communications.

To keep pace with these service enhancements, such devices have become more powerful and more complex. Portable computing devices now commonly include a system on chip (SoC) comprising various memory clients embedded on a single substrate (e.g., one or more central processing units (CPUs), a graphics processing unit (GPU), digital signal processors, etc.). The memory clients may request read and write transactions from one or more volatile memory devices electrically coupled to the SoC, such as, dynamic random access memory (DRAM) via double data rate (DDR) high-performance data and control interface(s). The DRAM may be combined with an on-chip cache to define a memory subsystem. The cache is a component that stores data so future requests for that data can be served faster. The cache may comprise a multi-level hierarchy (e.g., L1 cache, L2 cache, etc.) with a last-level cache that is shared among a plurality of memory clients.

Existing solutions for scheduling concurrent transactions to the memory subsystem employ a two-stage arbiter/scheduler. The first stage may function as an entry point to a last-level cache controller, and the second stage may function as an entry point to a DRAM controller. For example, a first arbiter selects one memory transaction at a time from a plurality of input buffers based on their relative priority level. The priority level defines a relative latency requirement for a transaction versus the others. The selected transactions are provided to a last-level cache controller. Transactions that do not hit a location in the last-level cache (i.e., a cache miss) may be provided to an input queue to a second arbiter. The second arbiter selects, from a set of cache-miss transactions in its input queue(s), a transaction that maximizes the DRAM bus utilization. This cascading of arbiters based on different criteria negatively impacts the complete system performance, including, for example, DRAM efficiency and latency.

Accordingly, there is a need for improved systems and methods for scheduling transactions in a memory subsystem comprising a last-level cache and DRAM.

SUMMARY OF THE DISCLOSURE

Systems, methods, and computer programs are disclosed for scheduling memory transactions. An embodiment of a method comprises determining future memory state data of a dynamic random access memory (DRAM) for a predetermined number of future clock cycles. The DRAM is electrically coupled to a system on chip (SoC). Based on the future memory state data, one of a plurality of pending memory transactions is selected that speculatively optimizes DRAM efficiency. The selected memory transaction is sent to a shared cache controller. If the selected memory transaction results in a cache miss, the selected memory transaction is sent to a DRAM controller.

Another embodiment is a system for scheduling memory transactions. The system comprises a volatile memory device and a system on chip (SoC) electrically coupled to the volatile memory. The SoC comprises a shared cached, a cache controller, and a transaction scheduler for scheduling pending memory transactions received from a plurality of memory clients. The transaction scheduler is configured to determine future state data of the volatile memory for a predetermined number of future clock cycles. Based on the future state data, the transaction scheduler selects one of the plurality of pending memory transactions that speculatively optimizes an efficiency of the volatile memory. The transaction scheduler sends the selected memory transaction to the shared cache controller and, if the selected memory transaction results in a cache miss, the selected memory transaction is sent to the volatile memory.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
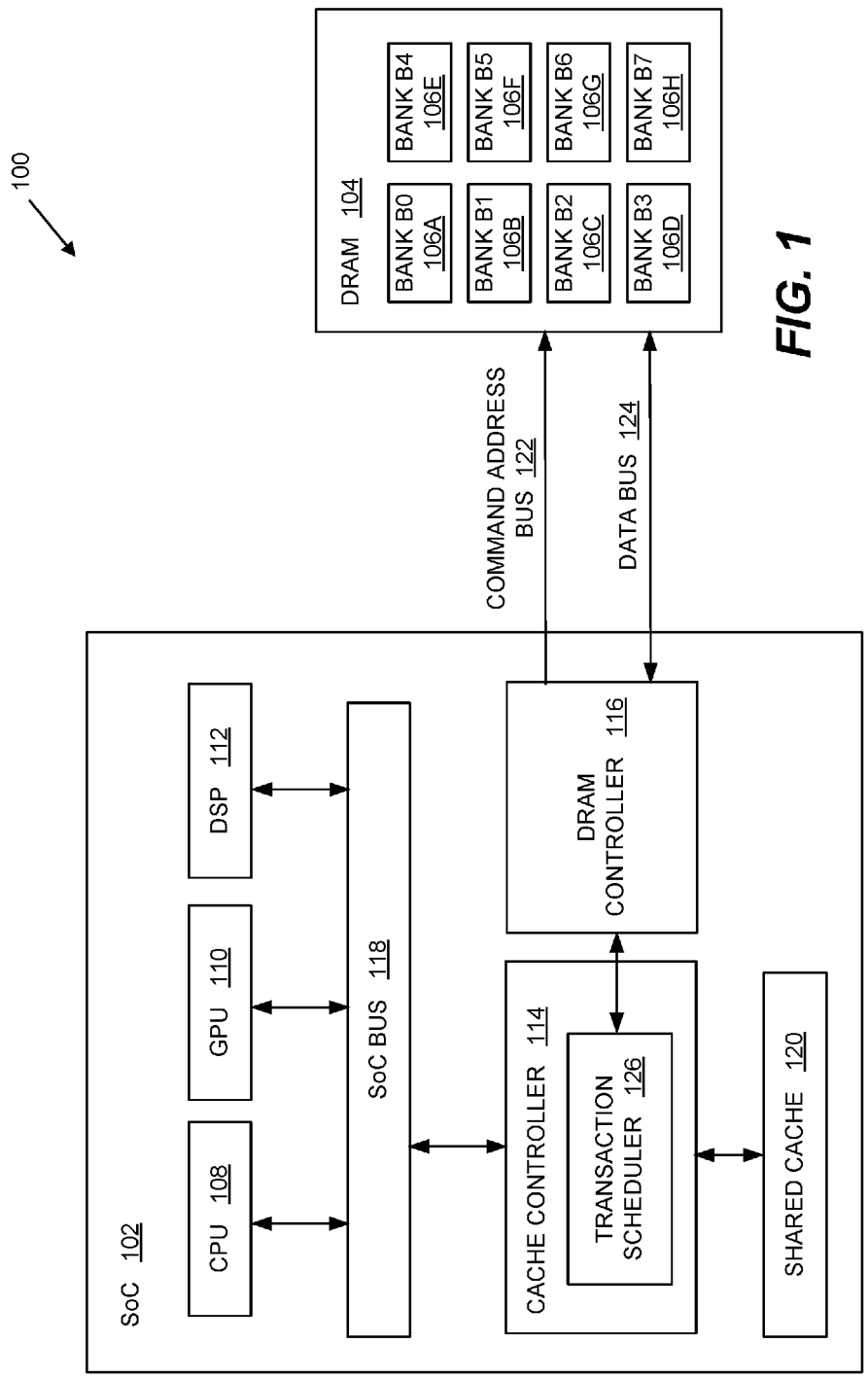
FIG. 1 is a block diagram of an embodiment of a system for implementing a single-stage memory arbiter/scheduler.

FIG. 1 illustrates a system 100 comprising a single-stage memory arbiter/scheduler for a memory subsystem. The system 100 may be implemented in any computing device, including a personal computer, a workstation, a server, or a portable computing device (PCD), such as a cellular telephone, a smart phone, a portable digital assistant (PDA), a portable game console, or a tablet computer. As illustrated in the embodiment of FIG. 1, the system 100 comprises a system on chip (SoC) 102 electrically coupled to one or more volatile memory devices or modules (e.g., DRAM 104). DRAM 104 comprises a plurality of banks with each bank defining a plurality of DRAM pages. In FIG. 1, eight banks B0-B7 (reference numerals 106A-106H) are illustrated, although there may be any number of banks. The SoC 102 comprises various on-chip components, including one or more memory clients, a DRAM controller 116, and a cache controller 114 interconnected via a SoC bus 118.

The memory clients request memory resources (read and/or write requests) from the memory subsystem comprising DRAM 104 and a shared cache 120. The memory clients may comprise one or more processing units (e.g., central processing unit (CPU) 108, a graphics processing unit (GPU) 110, digital signal processor (DSP) 112, etc.), a video encoder, or other clients requesting read/write access to the memory subsystem.

The DRAM controller 116 is electrically coupled to DRAM 104 and manages the flow of data going to and from DRAM 104 via, for example, a command address bus 122 and a data bus 124. DRAM controller 116 generally comprises the logic for reading and writing to DRAM 104. The cache controller 114 controls access to the shared cache 120. As generally illustrated in FIG. 1 and described below in more detail, the cache controller 114 includes a transaction scheduler 126 for implementing a single-stage arbiter/scheduler.

Figure 2:
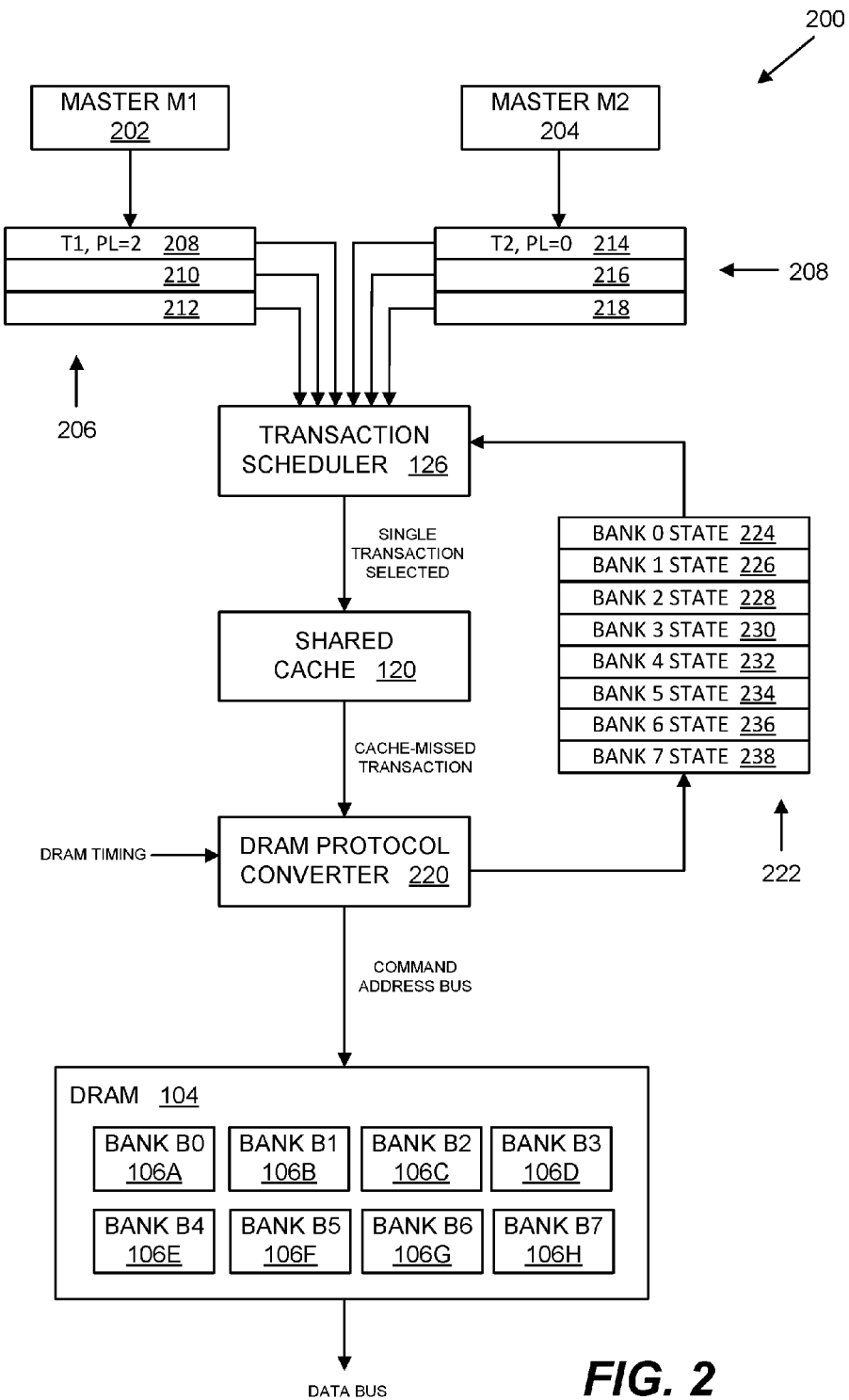
FIG. 2 is a block diagram illustrating an embodiment of a single-stage memory arbiter/scheduler.
Figure 3:
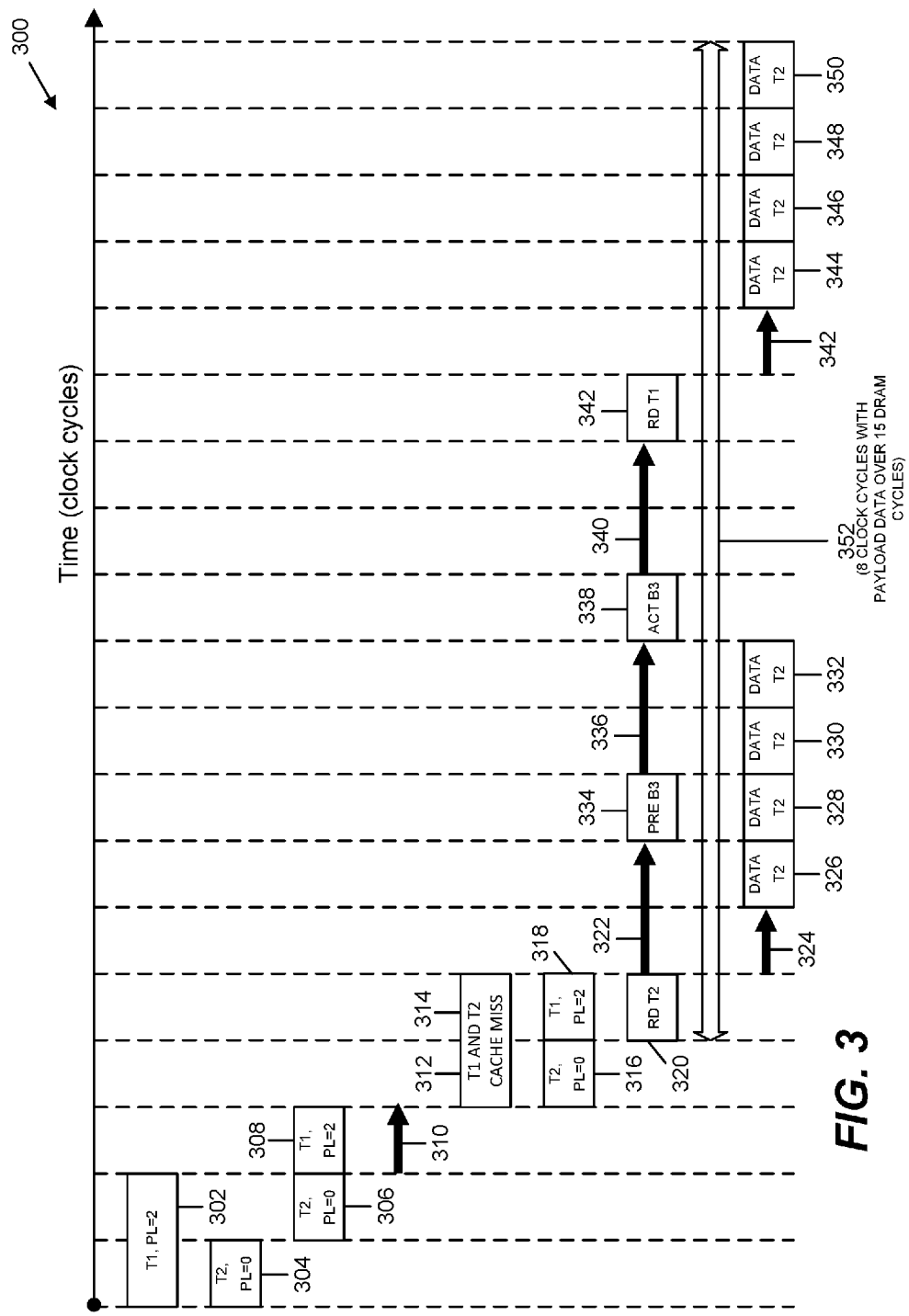
FIG. 3 is a flow/timing diagram illustrating an exemplary operation of the single-stage memory arbiter/scheduler of FIG. 2.

Various embodiments of the single-stage arbiter/scheduler will be described below with reference to FIGS. 2-5. The single-stage arbiter/scheduler may incorporate various mechanisms for scheduling transactions reaching a multi-ported memory subsystem comprising the shared cache 120 and DRAM 104. As described below in more detail, the single-stage arbiter/scheduler logic maximizes DRAM efficiency and Quality of Service for the various memory clients. In an embodiment, the single-stage arbiter/scheduler may be configured to provide two modes of operation for selectively controlling system memory performance and power. A first mode provides speculative cache miss prediction. Transactions reaching input queue(s) of a shared or last-level cache controller (LLCC) (e.g., cache controller 114—FIG. 1) may be simultaneously sent to the LLCC and the DRAM controller 116. In the example of FIG. 2, a first memory client (master M1 202) has an input queue 206, and a second memory client (master M2 204) has an input queue 208. The transaction scheduler 126 selects from the plurality of pending transactions in the input queues 206 and 208. For each selected transaction, the transaction scheduler 126 predicts whether a cache miss will occur. By simultaneously sending selected transactions to the cache controller 114 and the DRAM controller 116, the transaction scheduler 126 may enable the system 100 to mask latency introduced by the shared cache 120.

A second mode schedules the transactions based on states of the DRAM banks 106. A table or data structure 222 may store predicted DRAM state data for each of the DRAM banks. In the embodiment of FIG. 2, the table 222 comprises a plurality of data fields 224, 226, 228, 230, 232, 234, 236, and 238 for storing the DRAM state for banks 0-7, respectively. The predicted DRAM state data may define future memory state data that the DRAM 104 will have in a predetermined number of future clock cycles. The predetermined number of future clock cycles may represent an amount of time corresponding to a cache hit/miss detection latency associated with the cache controller 114. It should be appreciated that the latency of the cache controller 114 may not permit the system 100 to recover for transactions missing the cache controller 114. However, the second mode selectively enables lower memory power consumption by avoiding unnecessary DRAM accesses in the event of cache hits.

The transaction scheduler 126 may comprise various algorithm(s) for arbitrating/scheduling transactions from the input queues 206 and 208. In an embodiment, the transaction scheduler 126 has knowledge of the state and/or utilization of each of the DRAM banks 106 for completing previously scheduled transactions to these banks. For each bank, future clock cycles may be marked as free or busy with a corresponding command (e.g., a precharge command (PRE), an activate command (ACT), a read or write command, an auto-refresh command, etc.). The future clock cycles may be marked as "not available" to accommodate DRAM timing between commands needed for performing a read/write transaction or DRAM servicing actions. The union of the per-cycle busy states for all banks (see reference numeral 412 in FIG. 4) may provide a state of the command address bus 122. The transaction scheduler 126 may also have knowledge of the state and/or utilization of the DRAM data bus 124. The state of the DRAM data bus 124 for future clock cycles may be marked as free or busy based on the previously scheduled transactions and DRAM timings.

It should be appreciated that, with such future cycle occupancy knowledge, the arbiter/scheduling algorithm(s) may be configured to select transactions that meet certain predetermined set of criteria. For example, in an embodiment, the arbiter/scheduler can select a pending transaction if the following criteria are met: (1) this transaction can be immediately sent in the DRAM pipeline in the form of a DRAM command (PRE, ACT, RD or WR) without producing a collision on the command address bus 122; (2) the data transfer associated with this transaction can be sent to (write command) or received from (read command) the DRAM without producing a collision on the data bus 124; and (3) the selected transaction may not create a latency for a future transaction to the same bank higher than a programmed threshold. This latency criteria may comprise a Quality of Service rule for bonding the latency of transactions by avoiding low priority transactions to "flood" the DRAM pipelines and creates then for a following high priority transaction a latency above their requirement.

With such future occupancy knowledge, the transaction scheduler 126 may determine the state of the DRAM banks and/or buses for a predetermined number (N) of clock cycles ahead of a current clock cycle. In an embodiment, the predetermined number (N) may correspond to a latency for the cache controller 114 to deliver cache hit/miss information for any pending transaction that needs to be arbitrated/scheduled at the input ports of the cache controller 114.

FIG. 2 illustrates an exemplary operation for a first memory transaction T1 in input queue 206 and a second memory transaction T2 in input queue 208. The input queue 206 for master 202 comprises locations 208, 210, and 212 with location 208 corresponding to memory transaction T1. The input queue 208 for master 204 comprises locations 214, 216, and 218 with location 214 corresponding to memory transaction T2. Before describing the manner in which memory transactions T1 and T2 are scheduled in the single-stage arbiter/scheduler of FIG. 2, consider by contrast how they would be scheduled using a conventional two-stage arbiter/scheduler.

In a conventional two-stage arbiter/scheduler, transactions T1 and T2 hit a last-level cache arbiter. This last-level cache arbiter does not have knowledge of the cache misses or hit property for these two pending transactions. Let's consider the case where both transactions may not hit a last-level cache location and, therefore, may be sent to the DRAM controller, with transactions T1 and T2 both targeting DRAM bank B3. Transaction T1 may target a different page than the one currently open in bank B3, while transaction T2 may hit the currently open page in bank B3. Under these conditions, in order to maximize the DRAM efficiency (e.g., reducing the number of wasted DRAM clock cycles that represents the PRE and ACT commands and timings), the correct transaction ordering should be transaction T2 first followed by transaction T1.

However, the last-level cache arbiter is selecting one of the pending transactions using only the Priority Level (PL) information associated with the transactions, without using any criteria based on the DRAM bank state. Following the example illustrated in FIG. 2, consider that transaction T1 has PL=2, and transaction T2 has PL=0. In this scenario, the last-level cache arbiter will first send transaction T1 first to the last-level cache memory, which detects a cache-miss and then sends then transaction T1 to the DRAM controller. The last-level cache arbiter will then send transaction T2 to the last-level cache memory, which detects a cache-miss and then sends then the transaction T2 to the DRAM controller. The DRAM controller receives the transaction T1 first. In the absence of any other pending transaction that could maximize the DRAM efficiency, the DRAM controller schedules transaction T1 to the DRAM. As a result, bank B3 will be closed immediately (i.e., PRE command). After a timing delay (tRP), bank B3 will be activated (i.e., ACT command) for opening the page corresponding to an address for transaction T1. When transaction T2 arrives at the DRAM controller, as transaction T1 has been already scheduled and bank B3 is being precharged, transaction T2 is no more hitting an open page. Transaction T2 will need further PRE and ACT commands before its data is sent to or read from the DRAM memory. This causes DRAM efficiency degradation by adding unnecessary clock cycle overhead on DRAM memory.

Following the above example, consider the operation of the single-stage arbiter/scheduler of FIG. 2 receiving at the same clock cycle the transaction T1 (PL=2) issued by master 202 and the transaction T2 (PL=0) is issued by master 204. Because the last-level cache arbiter knows the state of DRAM 104 a predetermined number (N) clock cycles ahead of the current clock cycle, the transaction scheduler 126 may speculate that these two transactions may not hit a last-level cache location, and thus determine that transaction T2, if not hitting a last-level cache location, may hit an open page in bank B3 of the DRAM while transaction T1, if not hitting a last-level cache location, may conflict within bank B3. It should be appreciated that the single-stage arbiter/scheduler may improve DRAM efficiency because the transaction scheduler 126 may select to process transaction T2 before transaction T1 if these transactions are not hitting a last-level cache location. This results in much less wasted clock cycles on the DRAM bus for processing both T1 and T2 as shown in the timing diagram of FIG. 3. Reference numeral 302 and reference numerical 304 illustrate transaction T1 and T2, respectively, arriving on arbiter/scheduler in the same clock cycle t. Reference numeral 306 illustrates the selection by the single-stage arbiter/scheduler of transaction T2 in next clock cycle (t+1) based on its DRAM page hit property and despite its lower PL than T1. Reference numeral 308 illustrates the selection by the single-stage arbiter/scheduler of transaction T1 in clock cycle (t+2). Reference numeral 310 illustrates the Shared Cache hit or cache miss detection latency. Reference numeral 312 illustrates the delivery by the Shared Cache of the cache miss status for T2. Reference numeral 314 illustrates the delivery by the Shared Cache of the cache miss status for T1. Reference numeral 316 illustrates the delivery of transaction T2 to the DRAM Protocol Converter 220 (FIG. 2), which directly produce the Read command to the DRAM Command/Address bus as illustrated by reference numeral 320. Reference numeral 322 illustrates the required DRAM Read to Precharge command delay (tRTP). Reference numerals 324 and 342 illustrate the Read Latency (DRAM timing parameter RL) between Read command and delivery of corresponding data on DRAM data bus 124. Reference numerals 326, 328, 330, and 332 illustrate the cycles used for receiving the data from the DRAM as requested by transaction T2. Reference numerals 334, 338 and 342 illustrate the Precharge, Activate and Read commands, respectively, sent by the DRAM controller 116 as requested for executing transaction T1. Reference numeral 336 illustrates the required DRAM delay between a Precharge command and next Activate command to same bank (DRAM Row Precharge time (single bank) tRPpb). Reference numeral 340 illustrates the required DRAM delay between an Activate command and the Read command to same bank (DRAM RAS-to-CAS delay tRCD). Reference numerals 344, 346, 348, and 350 illustrate the cycles used for receiving the data from the DRAM as requested by transaction T1. Reference numeral 352 illustrates the total number of clock cycles used for completing both transactions T1 and T2. It should be appreciated that, if transaction T1 would have been selected before transaction T2 by a first arbiter stage using PL value as ordering criteria, the total number of clock cycles needed for completing execution of these two transactions would have been much larger.

As mentioned above, the transaction scheduler 126 may select from the set of pending memory transactions based on the corresponding priority levels and the DRAM bus/bank state data described above. The priority level may comprise information representing a relative latency indication between transactions. The transaction scheduler 126 uses the DRAM bus/bank state data to optimize operation of DRAM 104. In an embodiment, the transaction scheduler 126 may maximize DRAM efficiency by avoiding unnecessary clock cycles needed for pre-charging a DRAM bank 106 prior to activating the DRAM bank (i.e., opening a page inside the bank) and then accessing bank content on a per page basis. DRAM efficiency may be further maximized by avoiding unnecessary cycles on the DRAM data bus 124 to read/write data.

The transaction scheduler 126 may be configured to speculatively determine future memory state data for a predetermined number of future clock cycles. The future memory state data may comprise state data related to one or more of the following: DRAM command address bus 122, DRAM data bus 124, and DRAM banks 106. The transaction scheduler 126 speculatively determines the future memory state data that would be induced by each selected transaction. The transaction scheduler 126 may be further configured to revert back some or all of the speculative state data for the future clock cycles in the event that the selected transaction results in a cache hit.

The DRAM state data may be accumulated for each bank 106 and the data bus state for the future clock cycle based on the command that will speculatively be sent by the cache controller 114 to DRAM controller 116 if the transaction selected by the transaction scheduler 126 will not hit a cache location.

Figure 4:
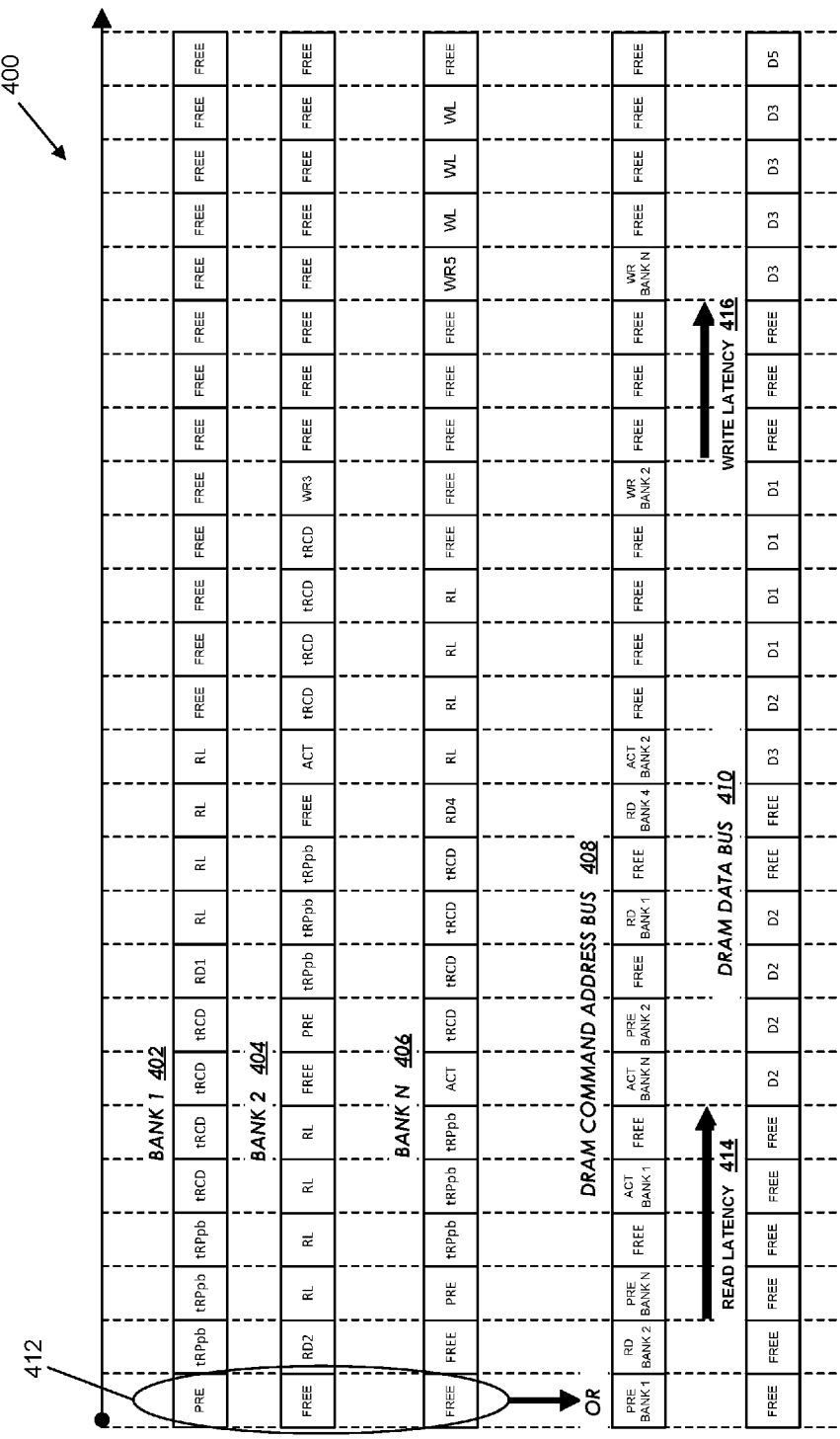
FIG. 4 illustrates an embodiment of DRAM state data for a predetermined number of future clock cycles.

FIG. 4 illustrates an embodiment of DRAM state data for a predetermined number of future clock cycles represented along the x-axis. Reference numeral 402 illustrates state data for a bank 1. Reference numeral 404 illustrates state data for a bank 2. Reference numeral 406 illustrates state data for a bank N. Reference numeral 408 illustrates state data for the DRAM command address bus 122. Reference numeral 410 illustrates state data for the DRAM data bus 410. It should be appreciated that the state accumulation data can be performed using a per-bank and per-bus occupancy vector with each cell of the vector corresponding to the state of the bank or bus for a future clock cycle, starting from a current clock cycle. The notations tRPpb, and tRCD refer to the DRAM requested delays between commands as described above in connection with the timing diagram of FIG. 3. Reference numeral 414 illustrates the requested delay between a Read command sent to DRAM and Read data returned by DRAM (DRAM Read latency timing, noted RL). Reference numeral 416 illustrates the requested delay between a Write command sent to DRAM and Write data sent to DRAM (DRAM Write latency timing, noted WL).

Figure 5:
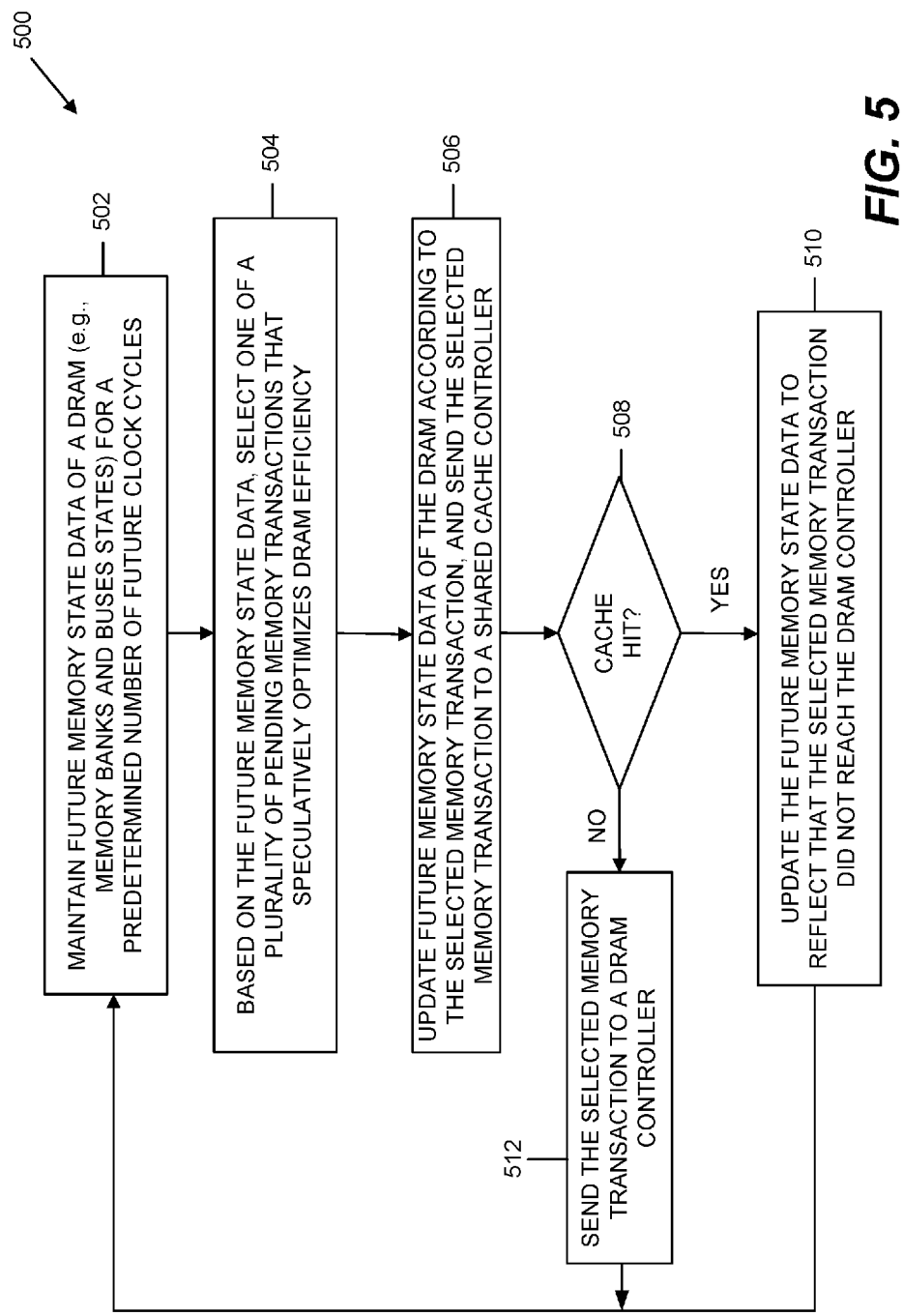
FIG. 5 is a flowchart illustrating an embodiment of a method implemented by the single-stage memory arbiter/scheduler of FIG. 2.

FIG. 5 is a flowchart illustrating an embodiment of a method 500 implemented by the single-stage memory arbiter/scheduler of FIG. 2. The method 500 may be performed at each clock cycle. At block 502, future memory state is determined for DRAM 104 over a predetermined number of future clock cycles. At block 504, the transaction scheduler 126 uses the future memory state data to select one of a plurality of pending memory transactions that speculatively optimizes DRAM efficiency. At block 506, the selected memory transaction is sent to the cache controller 114. If there is a cache miss, at block 512, the selected memory transaction may be sent to the DRAM controller 116. If there is a cache hit, at block 510, the future memory state data may be updated to reflect that the selected memory transaction did not reach the DRAM controller 116.

In another embodiment, the transaction scheduler 126 selects and sends to the shared cached 120 one transaction that maximize a cost function computed for each pending transaction based on any of the following:

a transaction priority level (PL);
the transaction, if missing the last-level cache (so after N clock cycles of the LLCC latency), may hit an open page in a DRAM bank, or an inactive bank;
the transaction direction (read or write) compared to the direction that the DRAM data bus direction will be in N clock cycles;
the DRAM command bus in N clock cycles from current clock cycles will be available for directly receiving a DRAM command (PREcharge, ACTivate, Read, or Write) requested for executing the transaction (e.g., a cost function of a transaction that could not be sent immediately as a DRAM command gets zeroed);
the DRAM data bus will be available for receiving (write transaction) or transmitting (read transaction) associated data WL or RL cycles after Write or Read command has been sent on DRAM address/command bus;
this command, if sent to the DRAM, respects all the DRAM timing requirements for the bank, and between banks (e.g., a cost function of a transaction that could violate a DRAM timing requirement gets zeroed).

The one among the transaction(s) having the highest cost function value may be selected by the arbiter/scheduler and sent to the last-level cache controller. The DRAM buses and bank states for the clock cycles located in future N and following cycles are updating speculatively (cache-miss speculation) based on this selected transaction. If after the N clock cycles of the cache latency, it is detected that the transaction is not hitting a cache location (cache-miss transaction), this transaction is then directly sent to the DRAM controller 116, which converts the transaction into DRAM commands (PREcharge, Activate, Read or Write commands) to be sent on DRAM command bus 122, and sends or receives data onto or from DRAM data bus 124. No reordering needs to take place in the DRAM controller 116 as the optimal order between transactions has already been done at the entry of the last-level cache by the single-stage arbiter/scheduler. The DRAM buses and banks states have already been marked correctly by the speculative cache-miss prediction at time of the scheduling to the cache controller 114.

If the transaction hits a cached location, then the cache memory returns the data for a read transaction or stores the data for a write, and the transaction is not sent to the DRAM controller 116. DRAM buses and bank states shall be updated to reflect the fact that the transaction is not reaching the DRAM controller 116 or the DRAM 104. This update may comprise more than simply freeing up the bank state for the clock cycles needed to execute the transaction. For example, during the N clock cycles of the cache latency, some other transactions to the same bank may have been already scheduled by the single-stage arbiter/scheduler based on the speculative state of the DRAM bank for that transaction (e.g., expecting that the bank has been already precharged and open to a page that is then hit by the transactions selected by the arbiter/scheduler). In this manner, a "command/state retraction" algorithm may be implemented.

When a transaction has been selected by the transaction scheduler 124, the DRAM bus/bank states may be updated as described above, before knowing if the selected transaction hits or misses a last-level cache location. If a cache miss occurs, then the forecasting DRAM bank/bus states becomes true. In case of a cache hit, the transaction scheduled to DRAM 104 becomes useless and should be retracted for saving DRAM bandwidth and power. But freeing the bank/bus state from a DRAM occupancy table may not be feasible if the transaction scheduler 124 has already selected other transactions based on the now invalidated state prediction. Following is a list of exemplary cases.

A DRAM bus and bank state table that maintains the potential states of each DRAM bank and of the DRAM Command/Address and Data buses for the future clock cycles, may be speculatively updated each time a transaction is selected by the arbiter/scheduler, and each time a transaction hits the last-level cache (for retracting the speculative DRAM commands not needed and not yet sent to DRAM). An arbiter/scheduler may select among several pending transactions the one to be sent to the last-level cache, based on its Priority Level and on the DRAM bank/bus states. A command retraction logic may be configured to remove, when possible (e.g., a command not yet sent to DRAM 104 and without any dependency with other speculative commands resulting from other transactions selected by the arbiter/scheduler), the speculative commands from the DRAM bus/bank state table.

Figure 6:
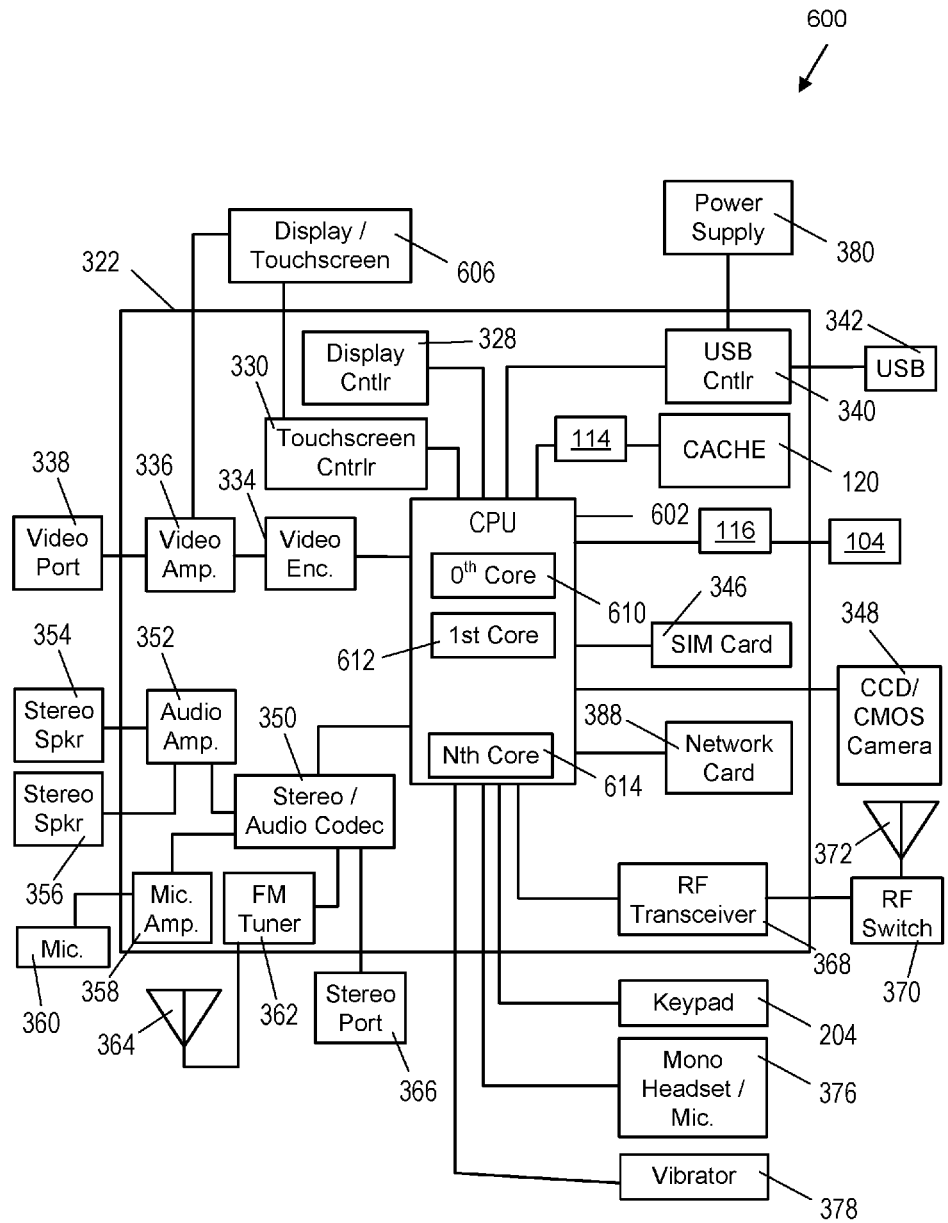
FIG. 6 is a block diagram of an embodiment of a portable communication device for incorporating the system of FIG. 1.

As mentioned above, the system 100 may be incorporated into any desirable computing system. FIG. 6 illustrates the system 100 incorporated in an exemplary portable computing device (PCD) 600. It will be readily appreciated that certain components of the system 100 (e.g., cache 120, cache controller 114, DRAM controller 116) are included on the SoC 322 (FIG. 6) while other components (e.g., the DRAM 104) are external components coupled to the SoC 322. The SoC 322 may include a multicore CPU 602. The multicore CPU 602 may include a zeroth core 610, a first core 612, and an Nth core 614. One of the cores may comprise, for example, a graphics processing unit (GPU) with one or more of the others comprising the CPU.

A display controller 328 and a touch screen controller 330 may be coupled to the CPU 1602. In turn, the touch screen display 606 external to the on-chip system 322 may be coupled to the display controller 328 and the touch screen controller 330.

FIG. 6 further shows that a video encoder 334, e.g., a phase alternating line (PAL) encoder, a sequential color a memoire (SECAM) encoder, or a national television system(s) committee (NTSC) encoder, is coupled to the multicore CPU 602. Further, a video amplifier 336 is coupled to the video encoder 334 and the touch screen display 606. Also, a video port 338 is coupled to the video amplifier 336. As shown in FIG. 6, a universal serial bus (USB) controller 340 is coupled to the multicore CPU 602. Also, a USB port 342 is coupled to the USB controller 340. Memory 104 and a subscriber identity module (SIM) card 346 may also be coupled to the multicore CPU 602.

Further, as shown in FIG. 6, a digital camera 348 may be coupled to the multicore CPU 602. In an exemplary aspect, the digital camera 348 is a charge-coupled device (CCD) camera or a complementary metal-oxide semiconductor (CMOS) camera.

As further illustrated in FIG. 6, a stereo audio coder-decoder (CODEC) 350 may be coupled to the multicore CPU 602. Moreover, an audio amplifier 352 may be coupled to the stereo audio CODEC 350. In an exemplary aspect, a first stereo speaker 354 and a second stereo speaker 356 are coupled to the audio amplifier 352. FIG. 6 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 6 further illustrates that a radio frequency (RF) transceiver 368 may be coupled to the multicore CPU 602. An RF switch 370 may be coupled to the RF transceiver 368 and an RF antenna 372. A keypad 204 may be coupled to the multicore CPU 602. Also, a mono headset with a microphone 376 may be coupled to the multicore CPU 602. Further, a vibrator device 378 may be coupled to the multicore CPU 602.

FIG. 6 also shows that a power supply 380 may be coupled to the on-chip system 322. In a particular aspect, the power supply 380 is a direct current (DC) power supply that provides power to the various components of the PCD 600 that require power. Further, in a particular aspect, the power supply is a rechargeable DC battery or a DC power supply that is derived from an alternating current (AC) to DC transformer that is connected to an AC power source.

FIG. 6 further indicates that the PCD 600 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 6, the touch screen display 606, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for scheduling transactions for a memory system, the method comprising:
   determining future memory state data of a dynamic random access memory (DRAM) for a predetermined number of future clock cycles, the DRAM electrically coupled to a system on chip (SoC);
   based on the future memory state data, selecting one of a plurality of pending memory transactions that speculatively optimizes DRAM efficiency;
   sending the selected memory transaction to a shared cache controller; and
   if the selected memory transaction results in a cache miss, sending the selected memory transaction to a DRAM controller.

2. The method of claim 1, wherein the selected pending memory transaction is determined based on the future memory state data and priority level data corresponding to the plurality of pending memory transactions.

3. The method of claim 1, wherein the selectively optimizing DRAM efficiency comprises reducing a number of DRAM clock cycles.

4. The method of claim 1, wherein the future memory state data comprises a bank state for each of a plurality of banks comprising the DRAM.

5. The method of claim 4, wherein the bank state comprises a free state or a busy state.

6. The method of claim 4, wherein the future memory state further comprises:
   a DRAM data bus state; and
   a DRAM command address bus state.

7. The method of claim 1, wherein the predetermined number of future clock cycles corresponds to a latency of the shared cache controller.

8. The method of claim 1, further comprising:
   if the selected memory transaction results in a cache hit, updating the future memory state data to reflect that the selected memory transaction did not reach the DRAM controller.

9. A system for scheduling memory transactions comprising:
   means for determining future memory state data of a dynamic random access memory (DRAM) for a predetermined number of future clock cycles, the DRAM electrically coupled to a system on chip (SoC);
   means for selecting one of a plurality of pending memory transactions that speculatively optimizes DRAM efficiency based on the future memory state data;
   means for sending the selected memory transaction to a shared cache controller; and
   means for sending the selected memory transaction to a DRAM controller if the selected memory transaction results in a cache miss.

10. The system of claim 9, wherein the means for selecting the one of the plurality of pending memory transactions that speculatively optimizes DRAM efficiency comprises: means for reducing a number of DRAM clock cycles.

11. The system of claim 9, wherein the future memory state data comprises a bank state for each of a plurality of banks comprising the DRAM.

12. The system of claim 11, wherein the bank state comprises a free state or a busy state.

13. The system of claim 11, wherein the future memory state further comprises:
   a DRAM data bus state; and
   a DRAM command address bus state.

14. The system of claim 9, wherein the predetermined number of future clock cycles corresponds to a latency of the shared cache controller.

15. The system of claim 9, further comprising:
   means for updating the future memory state data, if the selected memory transaction results in a cache hit, to reflect that the selected memory transaction did not reach the DRAM controller.

16. A system for scheduling memory transactions comprising:
a volatile memory device;
a system on chip (SoC) electrically coupled to the volatile memory, the SoC comprising a shared cached, a cache controller, and a transaction scheduler for scheduling pending memory transactions received from a plurality of memory clients, the transaction scheduler configured to:
determine future state data of the volatile memory for a predetermined number of future clock cycles;
based on the future state data, select one of the plurality of pending memory transactions that speculatively optimizes an efficiency of the volatile memory;
send the selected memory transaction to the shared cache controller; and
send the selected memory transaction to the volatile memory if the selected memory transaction results in a cache miss.

17. The system of claim 16, wherein the volatile memory comprises a dynamic random access memory (DRAM) comprising a plurality of banks.

18. The system of claim 17, wherein the future state data comprises a bank state for each of the plurality of banks.

19. The system of claim 18, wherein the bank state comprises a free state or a busy state.

20. The system of claim 18, wherein the future state data further comprises:
a DRAM data bus state; and
a DRAM command address bus state.

21. The system of claim 16, wherein the predetermined number of future clock cycles corresponds to a latency of the shared cache controller.

22. The system of claim 16, wherein the transaction scheduler is further configured to update the future state data of the volatile memory to reflect that the selected memory transaction did not reach the volatile memory.

23. The system of claim 16, incorporated in a portable communication device.

24. A computer program embodied in a memory and executable by a processor for scheduling memory transactions, the computer program comprising logic configured to:
determine future memory state data of a dynamic random access memory (DRAM) for a predetermined number of future clock cycles, the DRAM electrically coupled to a system on chip (SoC);
based on the future memory state data, select one of a plurality of pending memory transactions that speculatively optimizes DRAM efficiency;
send the selected memory transaction to a shared cache controller; and
if the selected memory transaction results in a cache miss, send the selected memory transaction to a DRAM controller.

25. The computer program of claim 24, wherein the selectively optimizing DRAM efficiency comprises reducing a number of DRAM clock cycles.

26. The computer program of claim 24, wherein the future memory state data comprises a bank state for each of a plurality of banks comprising the DRAM.

27. The computer program of claim 26, wherein the bank state comprises a free state or a busy state.

28. The computer program of claim 26, wherein the future memory state further comprises:
a DRAM data bus state; and
a DRAM command address bus state.

29. The computer program of claim 24, wherein the predetermined number of future clock cycles corresponds to a latency of the shared cache controller.

30. The computer program of claim 24, further comprising logic configured to:
if the selected memory transaction results in a cache hit, update the future memory state data to reflect that the selected memory transaction did not reach the DRAM controller.

* * * * *